United States Patent [19]

Hatano

[11] Patent Number: 5,724,105
[45] Date of Patent: Mar. 3, 1998

[54] TELEVISION SIGNAL RECEIVER

[75] Inventor: Hiroyuki Hatano, Kyoto, Japan

[73] Assignee: Rohm Co., Ltd., Kyoto, Japan

[21] Appl. No.: 673,152

[22] Filed: Jun. 25, 1996

[30] Foreign Application Priority Data

Jun. 26, 1995 [JP] Japan ................................. 7-159475

[51] Int. Cl.$^6$ ..................................................... H04N 5/50
[52] U.S. Cl. ........................... 348/725; 348/731; 348/735; 455/164.1; 455/192.1
[58] Field of Search .......................... 348/725, 726, 348/731–733, 536, 537, 524, 735; 455/139, 141, 164.1, 164.2, 180.3, 182.3, 192.1; H04N 5/80, 7/18

[56] References Cited

U.S. PATENT DOCUMENTS

| | | |
|---|---|---|
| 4,251,833 | 2/1981 | Fernsler et al. ................. 358/148 |
| 4,261,016 | 4/1981 | Hongu et al. . |
| 4,686,569 | 8/1987 | Campbell, III et al. . |
| 4,791,488 | 12/1988 | Fukazawa et al. ................. 348/536 |
| 4,802,009 | 1/1989 | Hartmeier ......................... 358/158 |
| 4,903,328 | 2/1990 | Ichikawa ......................... 455/164.2 |
| 5,363,419 | 11/1994 | Ho . |

*Primary Examiner*—Glenton B. Burgess
*Attorney, Agent, or Firm*—Nikaido Marmelstein Murray & Oram LLP

[57] ABSTRACT

A video detection unit is provided with a first control loop including a phase detector for comparing phases between the output of a voltage-controlled oscillator and the carrier of a VIF signal to output a control voltage, and a second control loop including a counter for measuring the output frequency of the oscillator to output a control voltage when the frequency is out of a predetermined range. The second control loop determines the free-run frequency of the oscillator. The first control loop makes the frequency and phase of the oscillator coincide with those of a carrier. The output of the counter is also used as an AFT voltage.

6 Claims, 4 Drawing Sheets

TELEVISION SIGNAL RECEIVER

BACKGROUND OF THE INVENTION

1. Field of the Invention

The present invention relates to a television signal receiver for use in television sets and videocassette recorders.

2. Description of the Prior Art

In a conventional television signal receiver, a video signal is detected from an intermediate-frequency signal (VIF). A sine-wave signal, which is necessary for detecting the signal, is generated by a voltage-controlled oscillator. The oscillator is controlled synchronously based on a video carrier (58.75 MHz in Japan) extracted from the VIF signal.

It is to be noted that the oscillator may have a free-run frequency considerably deviated from a predetermined frequency due to, for example, variation in characteristics of component devices thereof or variation resulting from production thereof. In that case, if the free-run frequency is out of the draw-in range of a control signal produced based on the image carrier, it is impossible to control the frequency to be a desired frequency. Accordingly, it is necessary to adjust constants of the tuning inductor and capacitor of the oscillator beforehand in order to obtain a desired free-run frequency. However, such adjustment is undesirable, because it demands extra production time and processes.

For this reason, in a conventional example as shown in FIG. 1, in addition to a first phase control loop (first PLL) 51 based on the video carrier, a second phase control loop (second PLL) 52 is also provided for forcibly shifting the frequency of the oscillator 31 into the draw-in range. In the figure, reference numeral 32 represents a phase comparator for comparing phases between the output of the oscillator 31 and the video carrier. The output of the phase compararison is smoothed by an integrator circuit consisting of a capacitor C3 and a resistor R3, and is then applied to the oscillator 31. The oscillator 31, the phase comparator 32, the capacitor C3 and the resistor R3 form the first phase control loop 51.

On the other hand, the output of the oscillator 31 is divided in the ratio of 1:235 by a frequency divider 33, and is then compared by a phase comparator 35 with a signal obtained by dividing a reference frequency signal of 4 MHz in the ratio of 1:16 by a frequency divider 34. The output of the phase comparison is smoothed by a capacitor C4, and applied through a resistor R4 to the oscillator 31 as a control voltage. The oscillator 31, the frequency divider 33, the phase comparator 35, the capacitor C4 and the resisitor R4 form the second phase control loop 52.

According to the above described construction, the frequency of the oscillator can be controlled based on a reference frequency signal. Consequently, it is possible to obtain a desired free-run frequency automatically without taking trouble to adjust the tuning inductor L and capacitor C, even if the oscillator has a deviated frequency.

However, the above described second phase control loop 52 based on the reference frequency signal is constantly active irrespective of whether the control based on the video carrier is active or not. If the control based on the reference signal is performed while the control based on the video carrier is active, the oscillator is subjected to a double phase control. The control based on the reference frequency signal aims at locking the output of the oscillator (VCO) on the phase of the reference frequency signal, whereas the control based on the video carrier aims at locking the output of the VCO on a phase coincident with the video carrier. Here, since the phase of the video carrier and the phase of the reference frequency signal are independent of each other, it is normally impossible to make the two coincide with each other.

Accordingly, when the two controls are performed simultaneously, since the frequency cannot lock on one frequency, the operation of the first PLL becomes unstable, causing phase fluctuation, because of the newly added phase control, as compared with when only the control based on the video carrier is performed. This leads to deterioration of picture quality.

Incidentally, a tuner generally undergoes a AFT (Automatic Fine Tuning) control so as to generate a VIF signal of a desired carrier frequency. For this purpose, an AFT voltage generating circuit is separately provided for generating a control voltage by discriminating the VIF signal.

SUMMARY OF THE INVENTION

An object of the present invention is to automatically control the free-run frequency of a voltage-controlled oscillator to be within a desired range without causing instability of frequency or delay of drawing-in in the signal detection stage.

Another object of the present invention is to perform AFT control without using an AFT voltage generating circuit.

To achieve the above objects, a television signal receiver of the present invention is provided with a voltage-controlled oscillator for generating a signal by which a VIF signal is multiplied for detection, a first control loop for comparing phases between a VIF carrier extracted from the VIF signal and an output from the oscillator and for controlling the oscillator according to results of the comparison, and a second control loop including a counter for controlling the oscillator according to an output voltage of the counter. The counter monitors an output frequency of the oscillator for a predetermined time to output a voltage when a monitored frequency is out of a predetermined range including a standard VIF carrier frequency. The counter in the second control loop also outputs an AFT voltage to be provided to a local oscillator in a tuner.

In such television signal receiver, the output of the oscillator is controlled by the first and second control loops. The first control loop is constantly active during detection of a VIF signal to make the frequency and the phase of the oscillator output coincide with those of the VIF carrier. Moreover, when the counter in the second control loop also outputs an AFT voltage to be provided to a local oscillator in a tuner, the output frequency of the local oscillator is controlled, and accordingly, the frequency of the VIF carrier is controlled.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
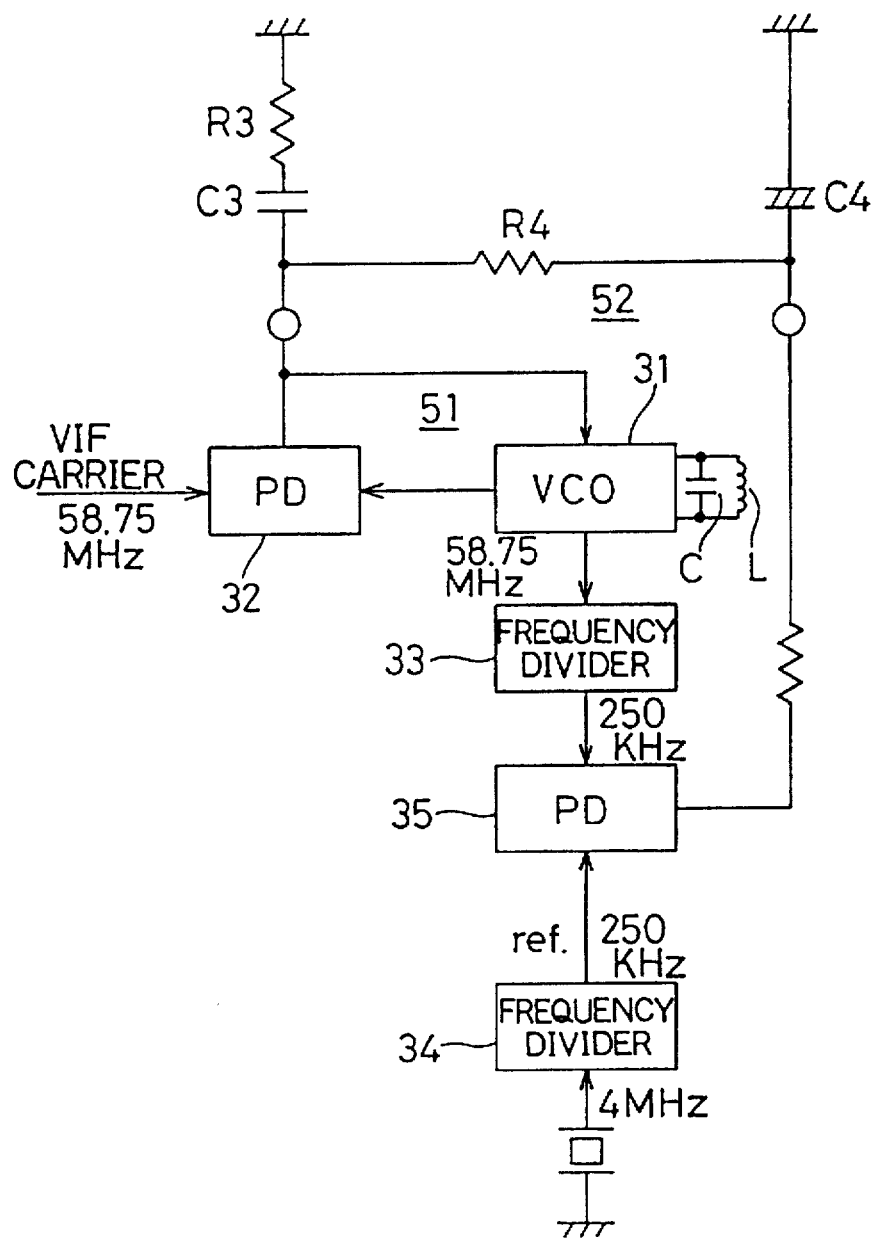
FIG. 1 is a block diagram showing the construction of a circuit for contolling the output of a voltage-controlled oscillator in a conventional example.
Figure 2:
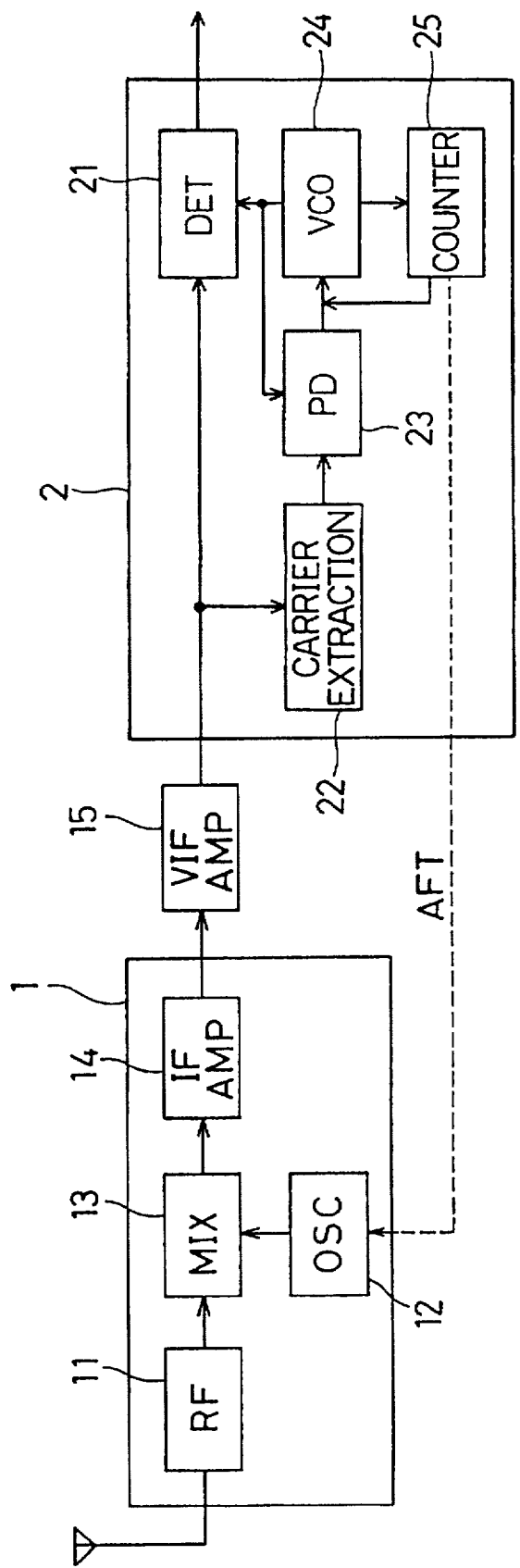
FIG. 2 is a block diagram showing the outline construction of the tuner and the video signal detector unit of an embodiment of the present invention.

With reference to the drawings, a television set incorporating the present invention will be described below. FIG. 2 shows the outline of the construction of the main portion, that is, the tuner unit and the video signal detector unit which are relevant to the present invention. In the figure, filters and like components are not shown. The remainder of the television set is constructed as in an ordinary television set. The tuner 1 includes a radio frequency amplifier 11 for amplifying a radio signal received through an antenna, a local oscillator 12, a mixer 13 for converting the output of the radio frequency amplifier 11 into a VIF signal having a frequency of approximately 58.75 MHz by use of the output of the local oscillator 12, and an intermediate frequency amplifier 14. The output of 5 the intermediate frequency amplifier 14 is further amplified by the VIF amplifier 15, and is then delivered to a video signal detector unit 2.

The video signal detector unit 2 comprises a synchronous detector 21, a VIF carrier extractor 22, a phase detector 23, a voltage-controlled oscillator 24, and a counter 25. The VIF carrier extractor 22 extracts a carrier from the VIF signal amplified by the VIF amplifier 15, and outputs the extracted carrier to the phase detector 23. The voltage-controlled oscillator 24 oscillates at approximately 58.75 MHz. The frequency and the phase of the output of this oscillator 24 vary according to the voltage input thereto. The phase detector 23 receives the carrier and the output of the oscillator 24 to detect a phase difference between the two, and outputs a voltage corresponding to the detected difference as a control voltage for controlling the oscillator 24. The synchronous detector 21 receives the amplified VIF signal and the output of the oscillator 24, detects the VIF signal in order to extract a video signal, and supplies the resultant signal to the video signal amplifier, which is not shown in the figure.

Figure 3:
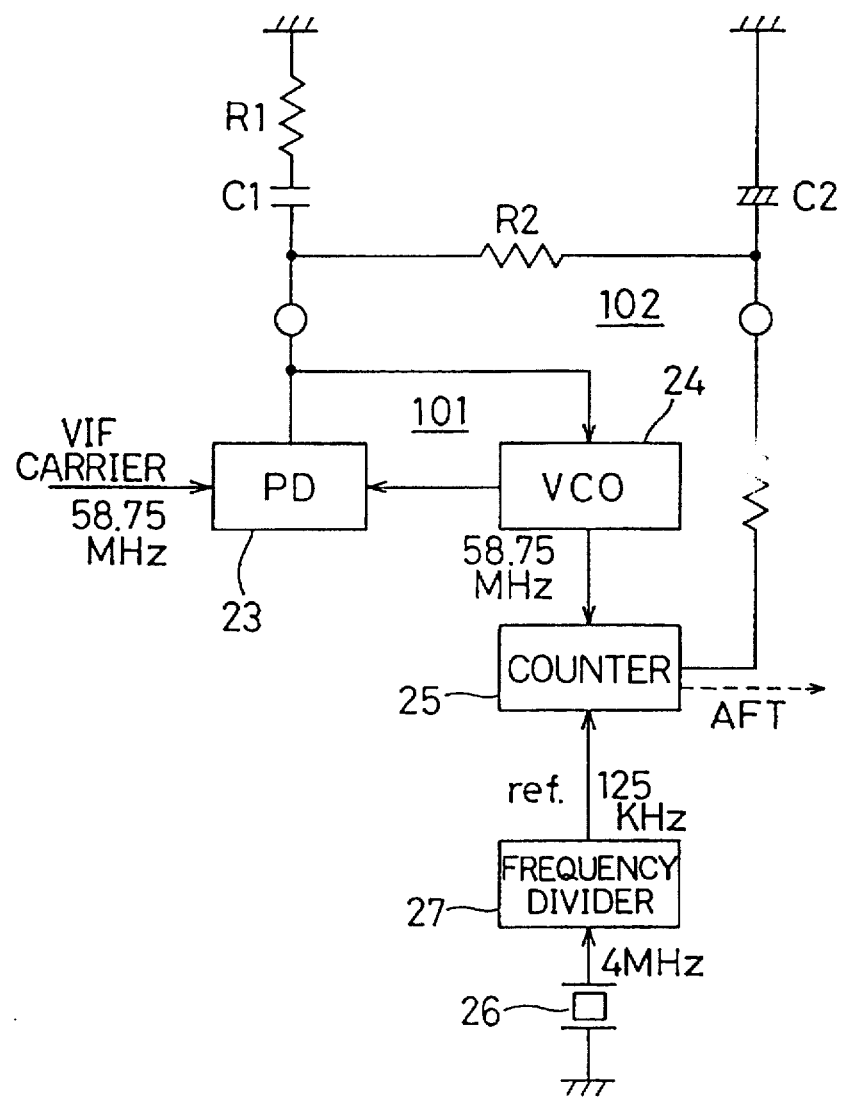
FIG. 3 is a block diagram showing the construction of a circuit for contolling the output of a voltage-controlled oscillator in the embodiment of the present invention.

FIG. 3 shows the construction of the circuit for controlling the output of the voltage-controlled oscillator 24. A crystal oscillator 26 is connected to the counter 25 through a frequency divider 27. The crystal oscillator 26 oscillates a reference signal having a frequency of 4 MHz, and its output is divided in the ratio of 1:32 by the frequency divider 27 into a signal having a frequency of 125 kHz, and the resultant signal is inputted to the counter 25. The counter also receives the output of the voltage-controlled oscillator 24.

The counter 25 counts the number of waves in the signal of approximately 58.75 MHz from the oscillator 24 using as a counting period T the cycle period of the 125 kHz reference signal. If the count value thus obtained in a period of T ($=1/125,000$) seconds is 470, the output frequency of the oscillator 24 is 58.75 MHz. A variation of ±1 in the count value corresponds to a variation of ±125 kHz in the frequency. The counter 25 counts the output of the oscillator every T seconds and outputs, if the count value is 471 or more, a predetermined positive voltage or, if the couht value is 469 or less, a negative voltage of the same absolute value as the above-mentioned positive voltage. The counter 25 does not output a voltage if the count value is 470.

Accordingly, the counter 25 does not output a voltage when the output frequency of the oscillator 24 is in the range of 58.75 MHz±125 kHz, and it outputs a voltage when the output, frequency of the oscillator 24 is out of that range. The relationship between the frequency of the voltage-controlled oscillator 24 and the output voltage of the counter 25 is shown in FIG. 4A.

The output voltage of the phase detector 23 is smoothed by an integrator circuit comprising a capacitor C1 and a resistor R1, and then input to the voltage-controlled oscillator 24. Thus, a first control loop 101 is formed. The first control loop 101 is a circuit generally referred to as a PLL (phase-locked loop). The output of the counter 25 is smoothed by a capacitor C2, and is input to the voltage-controlled oscillator 24 through a resistor R2. Thus, a second control loop 102 is formed.

A description will be given below as to how the above described construction controls the output of the voltage-controlled oscillator 24. In the free-run state, in which the tuner 1 does not output a VIF signal and the carrier extractor 22 does not feed a carrier to the phase detector, the phase detector 23 does not yield an output. Accordingly, the first control loop 101 remains inactive. Meanwhile, the voltage-controlled oscillator 24, the counter 25, the crystal oscillator 26 and the frequency divider 27 are active, and the counter 25 counts the number of waves in the output of the voltage-controlled oscillator every T seconds based on the reference frequency signal from the frequency divider 27. If the output frequency of the voltage-controlled oscillator 24 is within the range of 58.75 MHz±125 kHz, the number of waves counted in a period of T seconds is 470, and the counter 25 does not output a voltage.

Figure 4A:
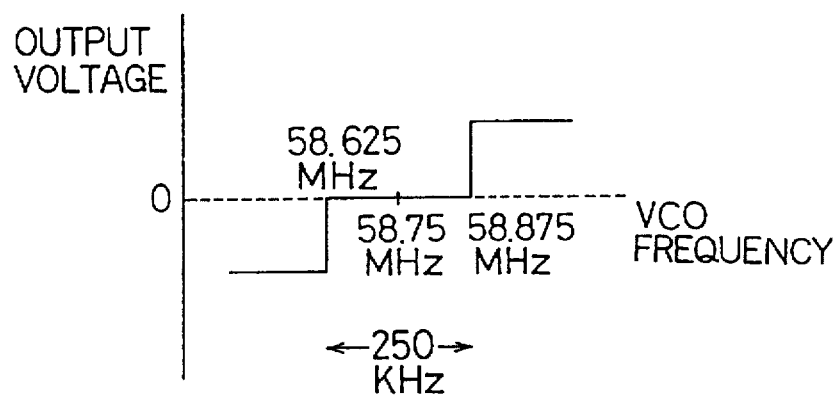
FIGS. 4A and 4B are diagrams showing the relationship between the output frequency of the voltage-controlled oscillator and the output voltage of the counter of the embodiment of the present invention.

If the output frequency of the voltage-controlled oscillator 24 is 58.875 MHz or higher, the count value is 471 or more, and the counter 25 outputs a positive voltage as shown in FIG. 4A. The output voltage is fed to the voltage-controlled oscillator to lower the output frequency of the oscillator 24. In contrast, if the output frequency of the voltage-controlled oscillator 24 is 58.625 MHz or lower, the count value is 469 or less, and the counter 25 outputs a negative voltage as shown in Of FIG. 4A. The output voltage is fed to the voltage-controlled oscillator to raise the output frequency of the oscillator 24. The voltage output from the counter 25 is continued until the count value becomes 470, and thus, by the second control loop 102, the free-run frequency of the voltage-controlled oscillator 24 is controlled to be within the range of 58.75 MHz±125 kHz.

When the tuner 1 outputs a VIF signal and a carrier is fed to the phase detector 23, the phase detector 23 starts comparing phases between the output of the voltage-controlled oscillator 24 and the carrier. If the phases of the two signals coincide with each other, the phase detector 23 does not yield an output so that the oscillation frequency and the phase of the voltage-controlled oscillator 24 is kept as they are. If the phases of the two signals do not coincide with each other, the phase detector 23 outputs a positive or negative voltage so that the frequency and the phase of the output of the voltage-controlled oscillator 24 coincide with those of the carrier.

Normally, as long as the first control loop 101 is active, the frequency of the voltage-controlled oscillator 24 does not deviate from the range of 58.75 MHz±125 kHz and, accordingly, the second control loop 102 remains inactive. When the oscillation frequency of the oscillator 24 deviates from the above-mentioned range for some reason, the second control loop 102 restarts operating so that the oscillation frequency is shifted back into the above-mentioned range by the first control loop 101 and the second cotrol loop 102.

Therefore, the second control loop 102 is chiefly used for setting the free-run frequency, while the first control loop 101 is used for phase adjuustment in the VIF signal detection.

The output of the voltage-controlled oscillator 24 is controlled as described above. On the other hand, the output voltage of the counter 25 can also be used as an AFT voltage for controlling the output frequency of the local oscillator 12 of the tuner 1 as shown in FIG. 2. Such a construction helps to simplify the construction of the apparatus as a whole, since it is not necessary to provide a separate circuit for generating the AFT voltage.

In the case of utilizing the output of the counter 25 as an AFT voltage, it is desirable to perform more pricise control with that output than with the output for the voltage-controlled oscillator 24. Such control allows the permissible range of frequency variation of the VIF signal to be made smaller than the permissible range of the free-run frequency. As an example, a description will be given below as to the case where the AFT voltage is controlled with double precision as compared with the control voltage for the voltage-controlled oscillator.

The counter 25 sums two successive count values of waves in the output signal from the voltage-controlled oscillator 24. If the sum is 940, the output frequency of the voltage-controlled oscillator 24 is 58.75 MHz. A variation of ±1 in the sum corresponds to a variation of ±62.25 KHz. If the sum is 941, the counter 25 outputs a positive AFT voltage. If the sum is 939, the counter 25 outputs a negative AFT voltage. If the sum is other than the above-mentioned values, that is, 938 or below, 940, or 942 or above, the counter 25 does not output a voltage. The determination of the AFT voltage to be output is performed every T seconds just as the determination of the voltage to be output for the voltage-controlled oscillator 24.

Figure 4B:
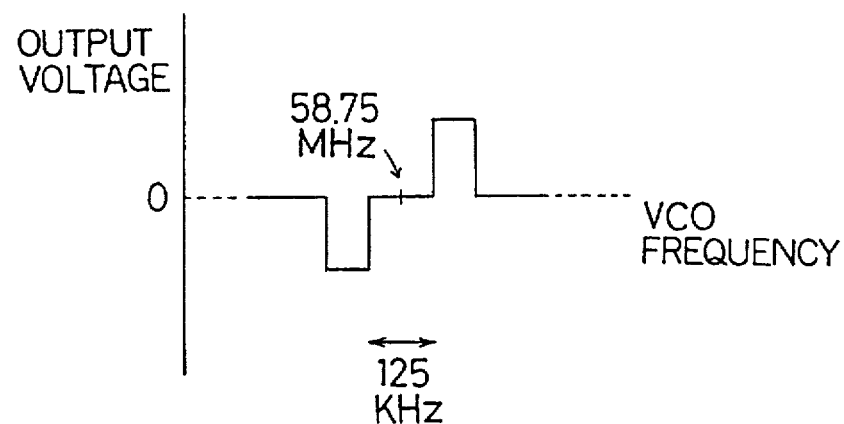

The relationship between the frequency of the voltage-controlled oscillator 24 and the AFT voltage output of the counter 25 is shown in FIG. 4B. The AFT voltage is output when the output frequency of the voltage-controlled oscillator 24 varies beyond the range of 125 kHz having its center at 58.75 MHz. As a result, the local oscillator 12 of the tuner 1 is controlled with double precision as compared with the control of the voltage-controlled oscillator 24 as shown in FIG. 4A. The AFT voltage is not output, however, when the output frequency of the voltage-controlled oscillator 24 varies beyond the range of 250 kHz, that is, when a voltage for the oscillator 24 is output.

Under the above-described setting, when the frequency of the VIF carrier varies beyond the range of 58.75 MHz±62.25 kHz, the counter 25 outputs an AFT signal to shift the frequency of the VIF carrier back into the above-mentioned range. Here, the control voltage for the voltage-controlled oscillator 24 is not output, and accordingly the second control loop 102 remains inactive. The voltage-controlled oscillator 24 is controlled by the first control loop 101 so that the frequency and the phase of the oscillation output coincide with those of the VIF carrier. In contrast, during setting of the free-run frequency by the second control loop 102, the AFT voltage is not output in order to avoid varying the frequency of the VIF carrier, and to prevent thereby instability of the oscillation frequency.

Although the reference signal that is fed to the counter 25 has a frequency of 125 kHz in this embodiment, the reference signal does not necessarily have this particular frequency, as long as the counter 25 can correctly detect a lapse of time based on the reference signal. It is allowable, therefore, to change the oscillation frequency of the crystal oscillator 26 to another frequency, to change the division ratio of the frequency divider 27 to a ratio other than 1:32, or even to exclude the frequency divider. It is also allowable to utilize as the crystal oscillator 28 an oscillator of another portion of the receiver, such as a reference oscillator of a channel selection apparatus of a frequency systhesizer type.

Moverover, although the free-run frequency of the voltage-controlled oscillator 24 has a range of 58.75 MHz±125 kHz in this embodiment, the range does not necessarily have a width of 250 kHz. It is allowable to set the range to a range including 58.75 MHz but having another width in view of variation in characteristics of component devices constituting the voltage-controlled oscillator 24 and other factors. The range for outputting the AFT voltage does not necessarily have a width of 125 to 250 kHz. The range may be a range having another width as long as it is within the range of the free-run frequency.

In a television signal receiver according to the present invention, since the free-run frequency of the voltage-controlled oscillator for detecting a VIF signal is automatically set by the second control loop, a VIF signal is properly detected even if there is variation in characteristics of component devices of the oscillator or variation resulting from production of the oscillator. Consequently, it is possible to improve the reliability of the receiver. Moreover, since it is not necessary to adjust tuning inductor and capacitor, it is possible to reduce production time and to increase production effciency. Further, since the second loop is active only when the output frequency of the oscillator deviates considerably from a desired frequency, the oscillator is controlled by the first control loop based only on the carrier frequency in signal detection after the completion of setting of the free-run frequency, in order to prevent instability of frequency or delay of drawing-in is. Consequently, it is possible to obtain a distortion-free VIF signal constantly. Moreover, since a circuit for generating an AFT voltage is not required, it is possible to realize the receiver in a simple construction.

What is claimed is:

1. A television signal receiver, comprising:

a voltage-controlled oscillator for generating a signal by which a VIF signal is multiplied for detection;

a first control loop for comparing phases between a VIF carrier extracted from the VIF signal and an output from the oscillator and for controlling the oscillator according to results of the comparison;

a second control loop including a counter for controlling the oscillator according to an output voltage of the counter, the counter monitoring an output frequency of the oscillator for a predetermined time to output a voltage when a monitored frequency is out of a predetermined range defined by a standard VIF carrier frequency.

2. A television signal receiver as claimed in claim 1, wherein the counter in the second control loop also outputs an AFT voltage to be applied to a local oscillator in a tuner.

3. A television signal receiver as claimed in claim 2, wherein the counter outputs the AFT voltage when a monitored output frequency of the oscillator is within the predetermined range.

4. A television signal receiver, comprising:

a voltage-controlled oscillator for generating a signal by which a VIF signal is multiplied for detection;

a phase detector for comparing phases between an output of the oscillator and a VIF carrier extracted from the VIF signal;

a low-pass filter connected to an output side of the phase detector;

means for applying an output of the low-pass filter to the oscillator as a control signal for the oscillator;

a reference frequency generator;

a divider for dividing a frequency generated by the reference frequency generator;

a counter connected to the oscillator and to the divider so as to receive the output of the oscillator and an output of the divider; and means for feeding an output of the counter to the low-pass filter so that the oscillator is controlled in accordance with the output of the counter, wherein the counter monitors an output frequency of the oscillator for a predetermined time to output a voltage when a monitored frequency is out of a predetermined range defined by a standard VIF carrier frequency.

5. A television signal receiver as claimed in claim 4, wherein the counter also outputs an AFT voltage to be applied to a local oscillator in a tuner.

6. A television signal receiver as claimed in claim 5, wherein the counter outputs the AFT voltage when a monitored output frequency of the oscillator is within the predetermined range.

* * * * *